United States Patent [19]
Yee

[11] Patent Number: 6,031,392
[45] Date of Patent: Feb. 29, 2000

[54] TTL INPUT STAGE FOR NEGATIVE SUPPLY SYSTEMS

[75] Inventor: Philip W. Yee, Los Altos, Calif.

[73] Assignee: Micrel Incorporated, San Jose, Calif.

[21] Appl. No.: 09/076,322

[22] Filed: May 11, 1998

[51] Int. Cl.⁷ ........................................................ G03B 1/24
[52] U.S. Cl. ................................. 326/80; 326/84; 326/89; 326/109
[58] Field of Search .................................. 326/80, 81, 83, 326/84, 86, 89, 63, 64, 109, 110; 327/205, 206

[56] References Cited

U.S. PATENT DOCUMENTS

| | | | |
|---|---|---|---|
| 4,945,265 | 7/1990 | Estrada | 307/455 |
| 5,013,938 | 5/1991 | Estrada | 307/455 |
| 5,561,382 | 10/1996 | Ueda et al. | 326/66 |

*Primary Examiner*—Michael Tokar
*Assistant Examiner*—Anh Tran
*Attorney, Agent, or Firm*—Skjerven, Morrill, MacPherson, Franklin & Friel LLP; Brian D. Ogonowsky

[57] ABSTRACT

A TTL input stage for negative supply voltage systems is described herein which obviates the need for a positive supply and a level shifter. In one embodiment, a first JFET current source, the emitter/collector of a PNP bipolar transistor, and a second JFET current source are connected in series between a control input and a negative supply voltage. The base of the bipolar transistor is connected to ground. At a control input of $2V_{be}$ above ground, the PNP transistor has a $V_{be}$ drop across its emitter/base junction, and each of the identical JFETs has a $V_{be}$ drop across it. An NPN bipolar transistor, having its base connected to the source of the second JFET and its emitter connected to the negative voltage, is turned on by the $V_{be}$ drop across the second JFET to provide the output of the TTL input stage. In one embodiment, the TTL input stage is a control circuit for turning an output MOSFET on and off. A circuit providing hysteresis of the threshold for switching between logic levels may be included as part of the TTL input stage.

19 Claims, 6 Drawing Sheets

TTL INPUT STAGE FOR NEGATIVE SUPPLY SYSTEMS

FIELD OF INVENTION

This invention relates to transistor-transistor logic (TTL) input stages used to decode standard TTL logic input signals and, in particular, to a TTL input stage used to control a system which utilizes only a negative voltage supply.

BACKGROUND OF THE INVENTION

Transistor-transistor logic (TTL) input stages typically require a positive supply voltage and use standard positive logic. The output of a TTL input stage must be low when its input is below 0.8 volts and high when its input is above 2.0 volts. This requirement must be met over the entire temperature range of operation. A specific example of TTL switching threshold voltages vs. temperature is shown in FIG. 1. The graph of FIG. 1 was obtained from an embodiment of the present invention. As illustrated by FIG. 1, a low output state is ensured over a range of temperatures where the input voltage is less than +0.8 volts, and a high output state is ensured over a range of temperatures when the input voltage is greater than +2.0 volts. Therefore, the high/low transition occurs somewhere between +0.8V and +2.0 V for the required range of temperatures.

A circuit which recognizes a high input level to be a logical 1 (true) and a low input level as a logical 0 (false) is said to use positive logic. TTL circuits which employ negative logic are also used.

TTL input stages typically require a positive supply voltage; however, some systems connected to the TTL output use only a negative supply voltage. Therefore, the requirement for a positive supply voltage to operate the TTL stage is cumbersome. Additionally, the TTL output signal has to be level shifted from a positive voltage to a negative voltage before it can control the system operating with a negative supply voltage. FIG. 2 (prior art) shows a typical TTL input stage 10 which requires a positive supply voltage and a level shifter 12 to control a system 14 using only a negative supply voltage.

What is needed is a TTL input stage for negative supply systems that does not require a positive supply.

SUMMARY

A TTL input stage for negative supply voltage systems is described herein which obviates the need for a positive supply and a level shifter. In one embodiment, a first JFET current source, the emitter/collector of a PNP bipolar transistor, and a second JFET current source are connected in series between a control input and a negative supply voltage. The base of the bipolar transistor is connected to ground. At a control input of $2V_{be}$ above ground, the PNP transistor has a $V_{be}$ drop across its emitter/base junction, and each of the identical JFETs has a $V_{be}$ drop across it. An NPN bipolar transistor, having its base connected to the source of the second JFET and its emitter connected to the negative voltage, is turned on by the $V_{be}$ drop across the second JFET to provide the output of the TTL input stage. In one embodiment, the TTL input stage is a control circuit for turning an output MOSFET on and off. A circuit providing hysteresis of the threshold for switching between logic levels may be included as part of the TTL input stage.

DETAILED DESCRIPTION OF THE EMBODIMENTS

A TTL input stage is described which does not require a positive supply and a level shifter to control a negative supply system. Numerous details are set forth, such as specific components and connections, in order to provide a thorough understanding of the present invention. It will be obvious, however, to one skilled in the art that the present invention may be practiced without these specific details.

Figure 1:
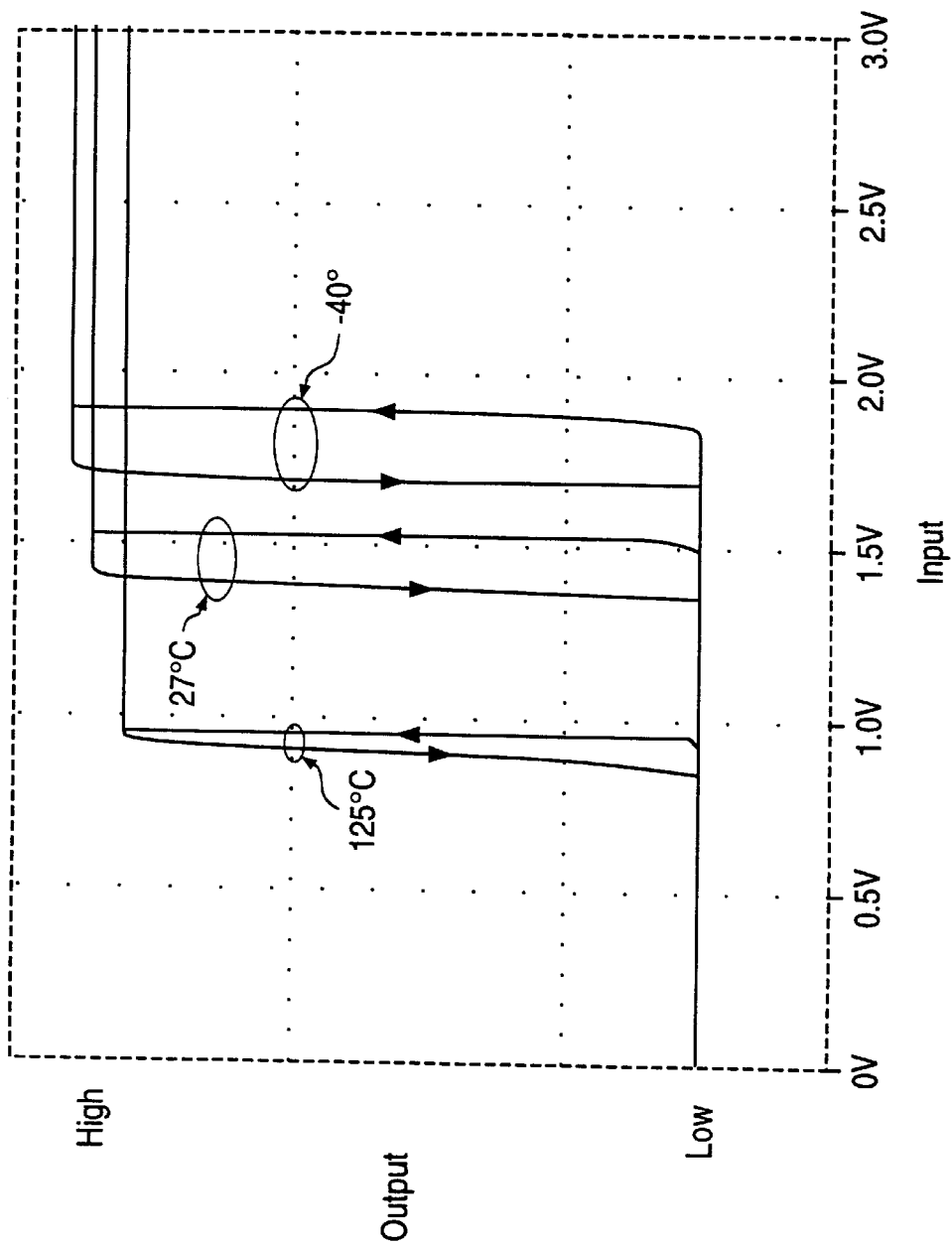
FIG. 1 illustrates the transition voltage of the preferred TTL stage as a function of temperature.
Figure 2:
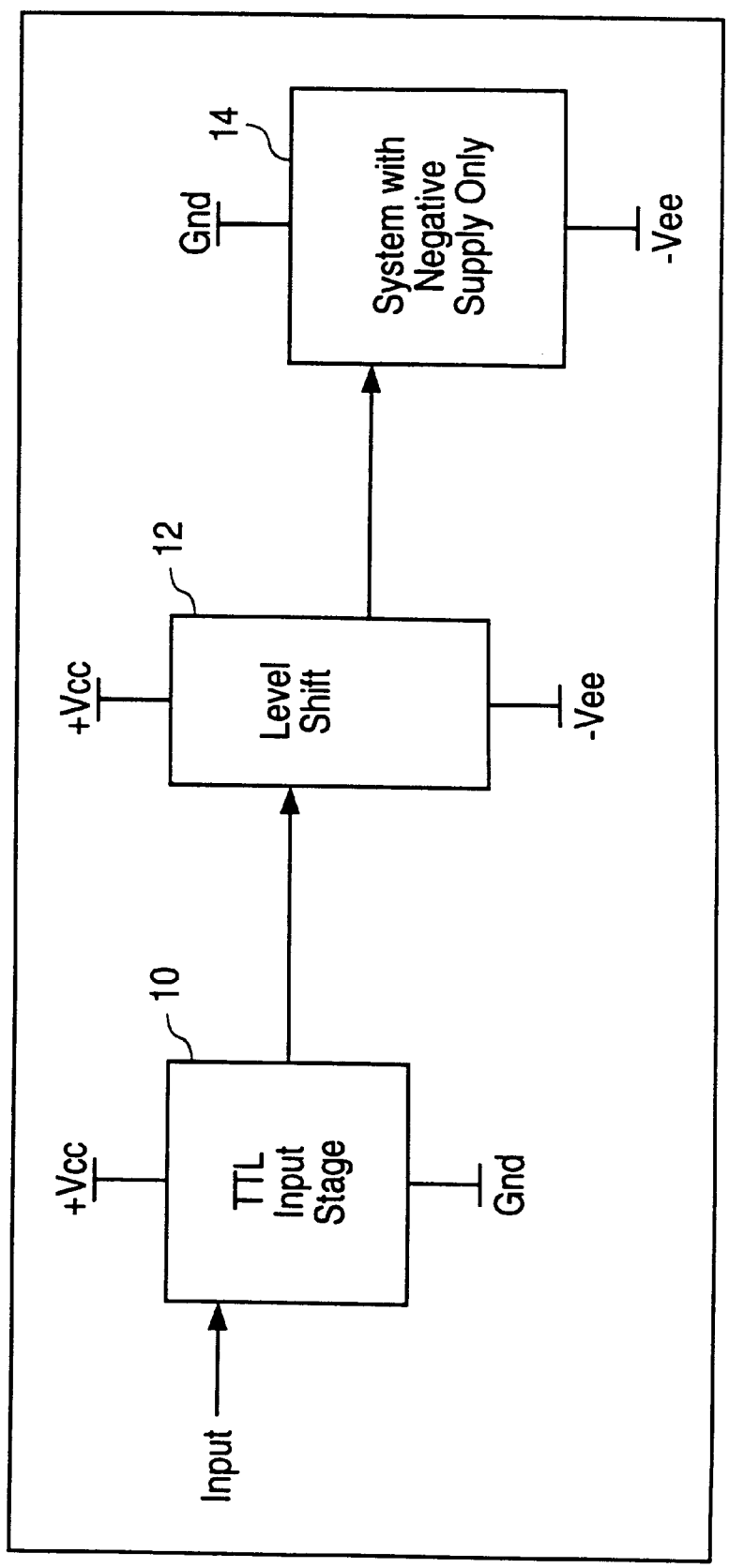
FIG. 2 illustrates a typical prior art system with a TTL input stage, requiring a positive supply, and a level shifter for controlling a negative supply system.
Figure 3:
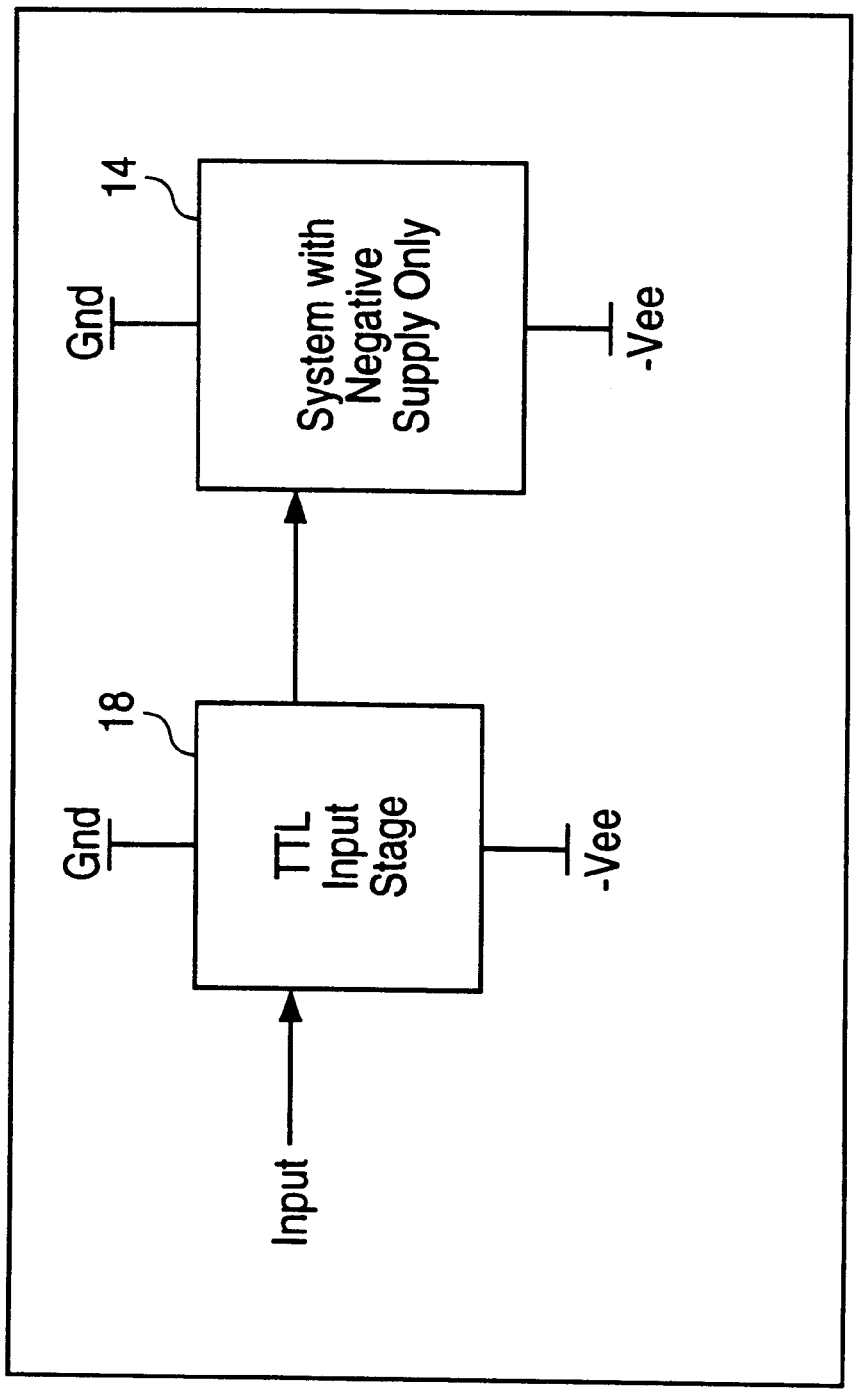
FIG. 3 illustrates a system of the preferred embodiment which includes a TTL input stage that obviates the need for a positive supply and a level shifter.

One system utilizing this new TTL input stage 18 is shown in FIG. 3, where the TTL input stage 18 is controlling a system 14 which uses only a negative supply voltage.

Figure 4:
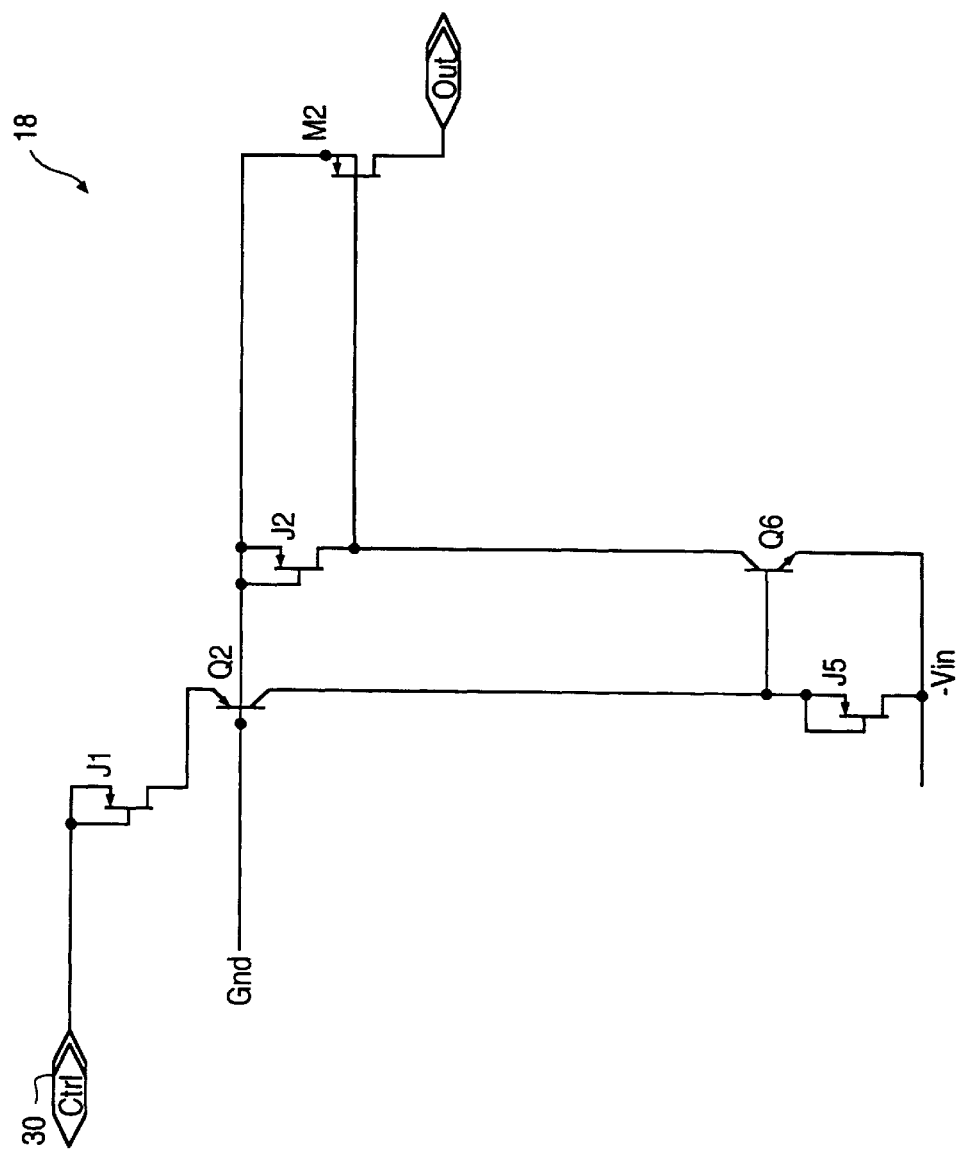
FIG. 4 illustrates one embodiment of a TTL control circuit for a MOSFET in accordance with one embodiment of the invention.

In one embodiment, shown in FIG. 4, the new TTL input stage consists of a main control circuit 18 for an output transistor.

The main control circuit 18 includes a p-channel junction field effect transistor (JFET) J1 with its gate connected to its source as a current source, a PNP transistor Q2 having its base connected to ground and its emitter connected to the drain of JFET J1, a p-channel JFET J2 having its gate connected to its source and ground, a p-channel JFET J5 having its gate connected to its source and the collector of transistor Q2, and an NPN transistor Q6 having its base connected to the source of JFET J5 and its collector connected to the drain of JFET J2. The drain of JFET J5 and the emitter of transistor Q6 are connected to a negative voltage $-V_{in}$.

The control circuit 18 controls a p-channel metal-oxide-semiconductor (PMOS) field effect transistor M2 for providing either a grounded output (control input 30 high) or a high impedance output (control input 30 low).

With control input 30 at ground, JFET J1 and PNP transistor Q2 are off. No current flows out of the collector of PNP transistor Q2. Therefore, JFET J5 pulls the base of NPN transistor Q6 to negative supply voltage $-V_{in}$, causing NPN transistor Q6 to be off. Since NPN transistor Q6 has no collector current, JFET J2 pulls the gate of PMOS transistor M2 to ground, causing PMOS transistor M2 to be off.

JFET J1 and JFET J5 are connected as resistive loads when operated in their linear region. At higher currents, the JFETs operate in their non-linear or flat region to limit current, which makes JFETs more desirable than resistors in this application. JFETs when used as resistive loads can also be devices such as, but not limited to, MOSFETs or resistors.

By varying the channel widths of JFET J1 and JFET J5, adjustments may be made in the high/low level transition point.

JFET J2 is connected as a current source and is always conducting to some extent to act as a pull-up resistor for the gate of transistor M2. JFET J2 can be any current source. For example, JFET J2 can be a depletion mode MOSFET with its gate tied to its source, or a resistor may be used.

PMOS transistor M2 is an optional device which acts as an open drain output of the TTL input stage, where off corresponds to a logic low. The main functions of PMOS transistor M2 are to invert the output signal at the collector of NPN transistor Q6 and provide current amplification. PMOS transistor M2 is shut off when its gate-to-source voltage is less than the threshold voltage of transistor M2.

NPN transistor Q6 will turn on when control voltage 30 is increased to $2V_{be}$ above ground (the TTL transition voltage). NPN transistor Q6 turns on when control voltage 30 is $2V_{be}$ above ground because one $V_{be}$ is dropped across the emitter-base of PNP transistor Q2, and a second $V_{be}$ is dropped across JFET J1. The channel widths of JFETs J1 and J5 are set so there is a drop of one $V_{be}$ across each of JFET J1 and JFET J5 to cause transistor Q6 to turn on when the control voltage 30 is $2V_{be}$. Since all the current from JFET J1 flows through PNP transistor Q2, JFET J5 is designed to be the same size as JFET J1 so that a $V_{be}$ appears across each of JFET J1 and JFET J5. At a control voltage 30 above $2V_{be}$, NPN transistor Q6 pulls the gate of PMOS transistor M2 down, which turns on PMOS transistor M2 to represent a logic high state.

As control voltage 30 continues to increase, the input current is controlled by the characteristics of JFET J1. By adjusting the size of JFET J1 (and matching JFET J5), the input current can be limited to a desired value. By adjusting the output impedance of JFET J1, the variation of input current with input voltage can be made as constant as required.

Since it is desirable that the TTL circuit not turn on and off at about the same voltage to avoid oscillations, a hysteresis circuit is added in the preferred embodiment.

Figure 5:
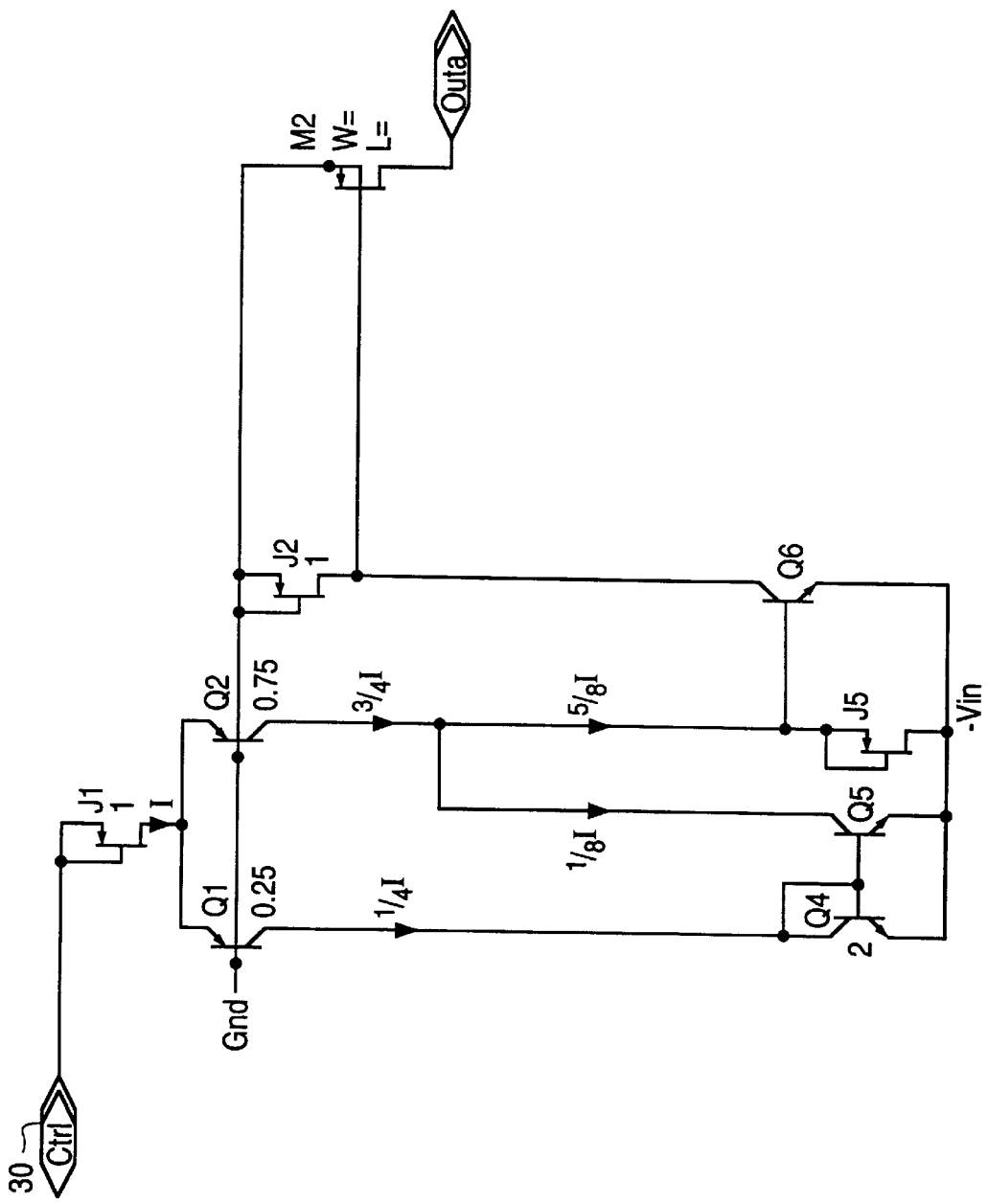
FIG. 5 illustrates an embodiment which includes a transition point adjustment circuit as part of the TTL input stage.
Figure 6:
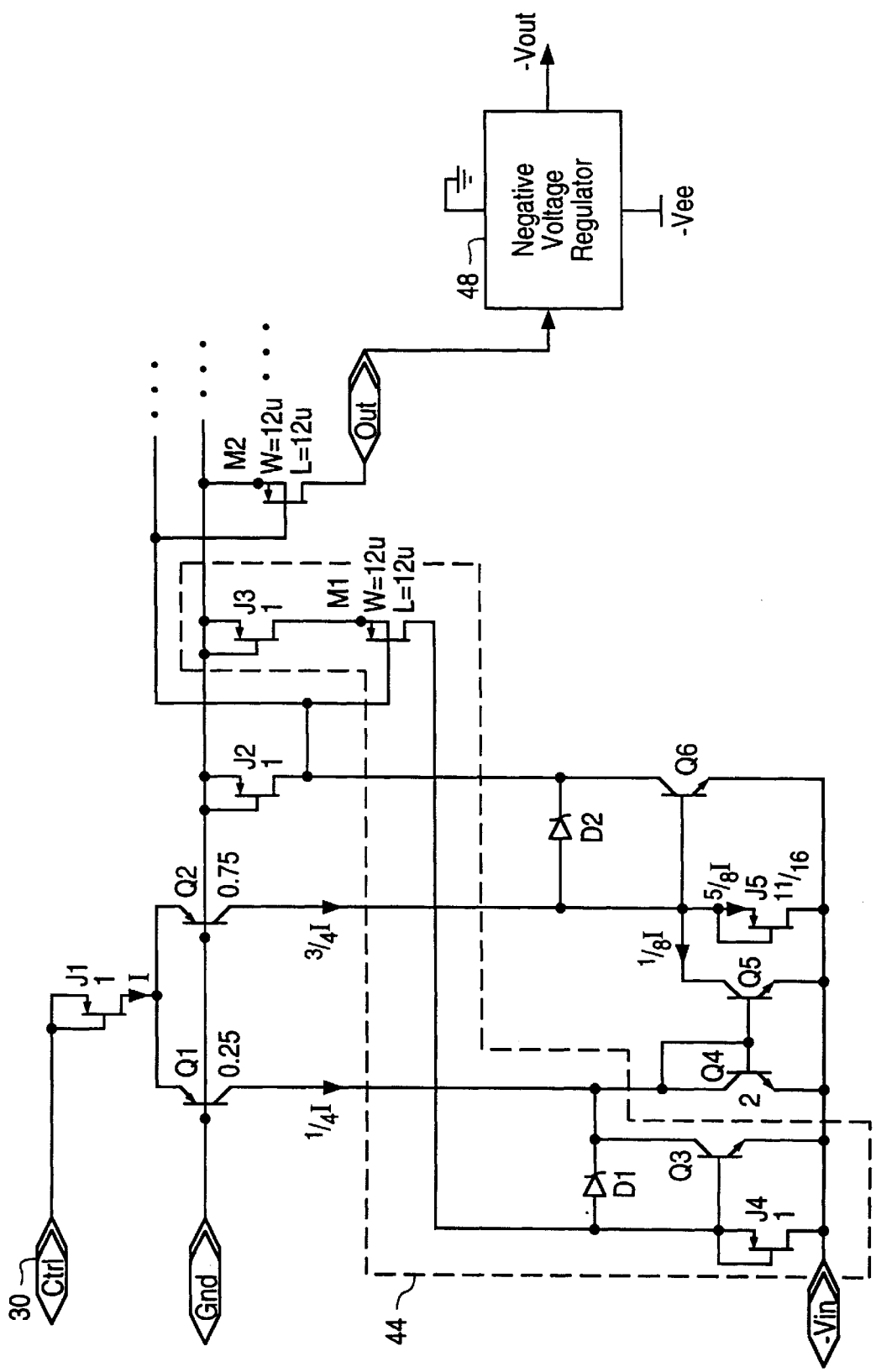
FIG. 6 illustrates an embodiment of the TTL input stage including a hysteresis circuit as part of the TTL input stage.

In one embodiment, hysteresis in the transition is implemented as shown in FIG. 6. In order to describe the operation of the hysteresis circuit, consider first FIG. 5 containing PNP transistor Q1, NPN transistor Q4, and NPN transistor Q5. All other components are identical to those in FIG. 4.

The circuit depicted in FIG. 5 operates as follows. When control voltage 30 is at ground, JFET J1 and PNP transistors Q2 and Q1 are off, and no current flows out of the collectors of PNP transistors Q2 and Q1. Therefore, JFET J5 pulls the base of NPN transistor Q6 to supply voltage $-V_{in}$, causing NPN transistor Q6 to be off. Because NPN transistor Q6 has no collector current, JFET J2 pulls the gate of PMOS transistor M2 to ground, causing PMOS transistor M2 to be off.

To illustrate how PNP transistors Q1 and Q2 and NPN transistors Q4 and Q5 adjust the transition level, first assume that PNP transistor Q1 and PNP transistor Q2 have a current ratio of 1:3 and NPN transistors Q4 and Q5 have a current ratio of 2:1. Therefore, ¼ of the current through JFET J1 flows through PNP transistor Q1 and NPN transistor Q4. NPN transistors Q4 and Q5 are connected as a current mirror. Thus, half of the current through NPN transistor Q4 is mirrored in NPN transistor Q5. The result is that NPN transistor Q5 will draw part of the current from PNP transistor Q2 away from JFET J5.

If JFETs J1 and J5 are matched, when control voltage 30 is increased to $2 V_{be}$, the voltage across JFET J5 is less than $1 V_{be}$ because only ⅝ of the current from JFET J1 is flowing through JFET J5. The transition from low to high will not occur until control voltage 30 is sufficiently greater than 2 $V_{be}$ such that the current through JFET J1 at the new voltage is equal to ⅘ times the current through JFET J1 when the control voltage 30 was 2 $V_{be}$. This condition will result in enough current through JFET J5 so that there is $1V_{be}$ across JFET J5. Adjusting the transition levels can be achieved by adjusting the channel width (current) ratio of JFETs J1 and J5.

If transition at 2 $V_{be}$ is desired, the size of JFET J5 must be ⅝ of JFET J1. However, this ratio is made slightly larger than ⅝ for the purpose of implementing hysteresis.

FIG. 6 illustrates additional elements in outline 44 in the hysteresis control circuit. The hysteresis in the transition is achieved by JFET J4, NPN transistor Q3, JFET J3, and PMOS transistor M1.

In the TTL input stage in FIG. 6, JFET J5 is set to be 1/16 the size of JFET J1. Lowering control voltage 30 from a high level results in a transition at $2V_{be}$ minus a delta voltage and then raising the control voltage 30 back up results in a transition which does not occur until 2 $V_{be}$ plus a delta voltage.

With control voltage 30 sufficiently greater than 2 $V_{be}$, PMOS transistor M1 is on, which turns on NPN transistor Q3 to draw all of the current supplied by PNP transistor Q1. Therefore, NPN transistors Q4 and Q5 are off and do not affect the base voltage of NPN transistor Q6 or the condition of the circuit as described in FIG. 4. Lowering control voltage 30 from a high level results in a transition from high to low as described in FIG. 4. At the transition from high to low, NPN transistor Q6 turns off, and the gates of PMOS transistors M1 and M2 are pulled up to ground. PMOS transistor M1 turns off, causing NPN transistor Q3 to be off.

Raising control voltage 30 up again does not turn on PMOS transistor M2 and cause a transition from low to high until control voltage 30 is at a delta voltage above 2 $V_{be}$, as described with respect to FIG. 5. Of the current through JFET J1, ¼ of the current flows through PNP transistor Q1 and NPN transistor Q4, ¾ of the current flows through PNP transistor Q2, ⅛ of the current flows through NPN transistor Q5, and ⅝ of the current flows through JFET J5. When control voltage 30 is raised up to 2 $V_{be}$, the voltage across JFET J5 is less than 1 $V_{be}$ since only ⅝ of the current from JFET J1 is flowing through JFET J5, and 11/16 of the current from JFET J1 is required for there to be a $V_{be}$ across JFET J5. Therefore, the transition from low to high will not occur until control voltage 30 is at a delta voltage above 2 $V_{be}$. The amount of hysteresis is centered around $2V_{be}$.

Adjusting the emitter size ratio of NPN transistors Q4 and Q5 and/or adjusting the emitter size ratio of PNP transistors Q2 and Q1 adjusts the amount of hysteresis during transition.

Schottky diodes D1 and D2 are added to prevent saturation of NPN transistors Q3 and Q6, respectively.

The drain current at transistor M2 in all embodiments can be used to control a negative supply system such as a negative voltage regulator 48 without level shifting.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. For example, although JFETs are used in the preferred embodiment, these components may be replaced with other suitable passive or active components.

What is claimed is:

1. A circuit comprising:
a transistor-transistor logic (TTL) stage comprising:
a first load having a first terminal and a second terminal, said first load having a first voltage drop across said first terminal and said second terminal when a control voltage is applied to said first terminal;
a first transistor having a control terminal electrically coupled to a reference voltage, said first transistor having a first current carrying terminal and a second current carrying terminal, said first current carrying terminal of said first transistor being electrically coupled to said second terminal of said first load;
a second load electrically coupled in series between said second current carrying terminal of said first transistor and a negative voltage;
a third load having a first terminal, electrically coupled to said reference voltage, and a second terminal, said second current carrying terminal providing an output of said TTL stage; and
a second transistor having a control terminal electrically coupled to said second current carrying terminal of said first transistor, said second transistor having a first current carrying terminal electrically coupled to said second terminal of said third load and having a second current carrying terminal electrically coupled to said negative voltage.

2. The circuit of claim 1 wherein:
said first load is directly coupled between said control voltage and said first current carrying terminal of said first transistor;
said second load is directly coupled in series between said second current carrying terminal of said first transistor and said negative voltage;
said third load is directly coupled between said reference voltage and said first current carrying terminal of said second transistor;
said second transistor is directly coupled between said second terminal of said third load and said negative voltage; and
said control terminal of said second transistor is directly coupled to said second current carrying terminal of said first transistor.

3. The circuit of claim 1 wherein said first and said second loads are resistive loads selected from the group consisting of JFET, resistor, and MOSFET, and wherein said third load is a current source.

4. The circuit of claim 1 further comprising a negative voltage supply system, said negative voltage supply system being electrically coupled to said second transistor's second current carrying terminal.

5. The circuit of claim 1 further comprising:
an output transistor having a control terminal electrically coupled to said output of said TTL stage, said output transistor having a first current carrying terminal and a second current carrying terminal, said first current carrying terminal of said output transistor being electrically coupled to said reference voltage; and
said second current carrying terminal of said output transistor providing a controlled output to an input of another circuit.

6. The circuit of claim 1 wherein said first load and said second load have a same channel width so that when said control voltage is at 2 $V_{be}$ above said reference voltage, said first voltage drop is 1 $V_{be}$ and said TTL stage has a transition voltage of 2 $V_{be}$.

7. The circuit of claim 1 further comprising a hysteresis circuit electrically coupled to said TTL stage.

8. The circuit of claim 7 wherein said hysteresis circuit comprises:
a third transistor having a control terminal electrically coupled to said reference voltage, said third transistor having a first current carrying terminal and a second current carrying terminal, said first current carrying terminal of said third transistor being electrically coupled to said second terminal of said first load, said first and said third transistor having a first ratio;
a fourth transistor electrically coupled in series between said second current carrying terminal of said third transistor and said negative voltage, said fourth transistor having a control terminal electrically coupled to said second current carrying terminal of said third transistor; and
a fifth transistor electrically coupled in series between said first transistor and said negative voltage, said fifth transistor having a control terminal electrically coupled to said control terminal of said fourth transistor, said fourth and said fifth transistors having a second current ratio.

9. The circuit of claim 8 wherein
said third transistor is directly coupled between said second terminal of said first load and said first current carrying terminal of said fourth transistor;
said fourth transistor is directly coupled between said third transistor and said negative voltage;
said fifth transistor is directly coupled between said second current carrying terminal of said first transistor and said negative voltage;
said control terminal of said fourth transistor is directly coupled to said control terminal of said fifth transistor; and
said control terminal of said fourth transistor is directly coupled to said second current carrying terminal of said third transistor.

10. The circuit of claim 8 wherein said first current ratio and said second current ratio adjust an amount of hysteresis for switching said output of said TTL stage by said control voltage, and said first load and said second load adjust a transition voltage of said TTL stage.

11. The circuit of claim 8 further comprising:
a fourth load having a first terminal and a second terminal, said first terminal connected to said reference voltage;
a sixth transistor having a control terminal electrically coupled to said output of said TTL stage, said sixth transistor having a first terminal electrically coupled to said second terminal of said fourth load and having a second current carrying terminal;
a fifth load electrically coupled in series between said second current carrying terminal of said sixth transistor and said negative voltage; and
a seventh transistor having a control terminal electrically coupled to said second current carrying terminal of said sixth transistor, said seventh transistor having a first current carrying terminal and a second current carrying terminal, said second current carrying terminal of said seventh transistor being electrically coupled to said negative voltage.

12. The circuit in claim 11 wherein:
said fourth load is directly coupled between said reference voltage and said first current carrying terminal of said sixth transistor;

said fifth load is directly coupled between said second current carrying terminal of said sixth transistor and said negative voltage;

said control terminal of said sixth transistor is directly coupled to said output of said TTL stage;

said seventh transistor is directly coupled between said second current carrying terminal of said third transistor and said negative voltage; and said control terminal of said seventh transistor is directly coupled to said second current carrying terminal of said sixth transistor.

13. The circuit in claim 11 further comprising:

a first diode electrically coupled between said first current carrying terminal of said second transistor and said second current carrying terminal of said first transistor; and a second diode electrically coupled between said second current carrying terminal of said third transistor and said second current carrying terminal of said sixth transistor.

14. The circuit of claim 11 further comprising:

an output transistor having a control terminal electrically coupled to said output of said TTL stage, said output transistor having a first current carrying terminal and a second current carrying terminal, said first current carrying terminal of said output transistor being electrically coupled to said reference voltage; and said second current carrying terminal of said output transistor being connected to an input of another circuit.

15. The circuit of claim 11 further comprising a negative voltage supply system, said negative voltage supply system being coupled to said fifth load.

16. The circuit of claim 8 further comprising:

an output transistor having a control terminal electrically coupled to said output of said TTL stage, said output transistor having a first current carrying terminal and a second current carrying terminal, said first current carrying terminal of said output transistor being electrically coupled to said reference voltage; and said second current carrying terminal of said output transistor being connected to an input of another circuit.

17. The circuit of claim 8 further comprising a negative voltage supply system, said negative voltage supply system being coupled to said fourth transistor.

18. A method performed by a transistor-transistor logic (TTC) stage to decode TTL signals to generation an output signal comprising:

applying a control voltage to a first current carrying terminal of a first load, said first load having a first voltage drop across said first current carrying terminal and a second current carrying terminal when said control voltage is applied to said first current carrying terminal;

applying a reference voltage to a control terminal of a first transistor, said first transistor having a first current carrying terminal and a second current carrying terminal, said first current carrying terminal of said first transistor being electrically coupled to said second current carrying terminal of said first load;

generating a second voltage drop across a second load electrically coupled in series between said second current carrying terminal of said first transistor and a negative voltage;

applying said reference voltage to a first current carrying terminal of a third load, said third load also having a second current carrying terminal, said second current carrying terminal providing an output of said TTL stage; and applying a voltage at said second current carrying terminal of said first transistor to a control terminal of a second transistor, said second transistor having a first current carrying terminal electrically coupled to said second current carrying terminal of said third load and having a second current carrying terminal electrically coupled to said negative voltage.

19. The method of claim 18 further comprising hysteresis such that said output of said TTL stage is changed from a logical high level to a logical low level at a control voltage magnitude that is different from that needed to change said output from a logical low level to a logical high level.

* * * * *